US012603626B2

(12) United States Patent (10) Patent No.: US 12,603,626 B2
Cheng et al. (45) Date of Patent: Apr. 14, 2026

(54) MULTI-PHASE-BASED DOHERTY POWER AMPLIFIER METHOD AND APPARATUS

(71) Applicant: HUAWEI TECHNOLOGIES CO., LTD., Shenzhen (CN)

(72) Inventors: Qianfu Cheng, Chengdu (CN); Hua Cai, Chengdu (CN); Guangjian Wang, Chengdu (CN)

(73) Assignee: Huawei Technologies Co., LTD., Shenzhen (CN)

( * ) Notice: Subject to any disclaimer, the term of this patent is extended or adjusted under 35 U.S.C. 154(b) by 717 days.

(21) Appl. No.: 17/983,549

(22) Filed: Nov. 9, 2022

(65) Prior Publication Data

US 2023/0073967 A1     Mar. 9, 2023

Related U.S. Application Data

(63) Continuation of application No. PCT/CN2021/091607, filed on Apr. 30, 2021.

(30) Foreign Application Priority Data

May 9, 2020     (CN) .......................... 202010386745.1

(51) Int. Cl.
$H03F\ 1/02$ (2006.01)
$H03F\ 3/24$ (2006.01)
$H03G\ 3/30$ (2006.01)
(52) U.S. Cl.
CPC ......... *H03G 3/3042* (2013.01); *H03F 1/0288* (2013.01); *H03F 3/245* (2013.01); *H03F 2200/336* (2013.01)
(58) Field of Classification Search
CPC .. H03F 1/0288; H03F 3/245; H03F 2200/336; H03F 3/2173; H03F 2200/451;
(Continued)

(56) References Cited

U.S. PATENT DOCUMENTS

2004/0263246 A1     12/2004 Robinson et al.
2009/0180530 A1*     7/2009 Ahn .......................... H03F 3/24
                                                                         375/297
(Continued)

FOREIGN PATENT DOCUMENTS

CN          102683141 A     9/2012
CN          104283573 A     1/2015
CN          110679081 A     1/2020

OTHER PUBLICATIONS

Yuan et al., "A Quadrature Switched Capacitor Power Amplifier," IEEE Journal of Solid-State Circuits, vol. 51, No. 5, Jan. 26, 2016, pp. 1200-1209.
(Continued)

*Primary Examiner* — Andrea Lindgren Baltzell
*Assistant Examiner* — Khiem D Nguyen
(74) *Attorney, Agent, or Firm* — Fish & Richardson P.C.

(57) ABSTRACT

This application discloses example multi-phase-based Doherty power amplifier control methods and apparatus. An example method includes obtaining a baseband signal and generating two vector signals based on the baseband signal, where the two vector signals each include a phase signal and amplitude signal, and the two vector signals are non-orthogonal signals. Amplitude control signals of a target power amplifier are obtained based on quantization encoding of amplitude signals of the two vector signals, where the target power amplifier includes a main and power amplifier, and the main and auxiliary power amplifier each include a plurality of working cells. Phase control signals of the target power amplifier are obtained based on phase signals of the two vector signals. Based on the phase control signals and the amplitude control signals, a plurality of working cells in the main power amplifier and the auxiliary power amplifier to output power signals are controlled.

20 Claims, 6 Drawing Sheets

(58) Field of Classification Search

CPC ......... H03F 3/211; H03F 1/02; H03G 3/3042; H03M 1/66; H04B 1/04; H04B 2001/0408

USPC .............................................. 330/124 R, 295

See application file for complete search history.

(56) References Cited

U.S. PATENT DOCUMENTS

| | | | |
|---|---|---|---|
| 2018/0019711 A1 | 1/2018 | Wang et al. | |
| 2019/0386690 A1* | 12/2019 | Hashemi ................... | H03F 3/21 |

OTHER PUBLICATIONS

Vorapipat et al., "Voltage Mode Doherty Power Amplifier," IEEE Journal of Solid-State Circuits, vol. 52, No. 5, May 2017, pp. 1295-1304.

Vorapipat et al., "A Class-G Voltage-Mode Doherty Power Amplifier," IEEE Journal of Solid-State Circuits, vol. 52, No. 12, Dec. 2017, pp. 3348-3360.

Hu et al., "A broadband CMOS digital power amplifier with hybrid Class-G Doherty efficiency enhancement," 2015 IEEE International Solid-State Circuits Conference—(ISSCC) Digest of Technical Papers, Feb. 23, 2015, pp. 1-3.

Yuan et al., "A Multiphase Switched Capacitor Power Amplifier," IEEE Journal of Solid-State Circuits, vol. 52, No. 5, Dec. 7, 2016, pp. 1320-1330.

International Search Report and Written Opinion in International Appln. No. PCT/CN2021/091607, mailed on Jul. 15, 2021, 18 pages (with English translation).

* cited by examiner

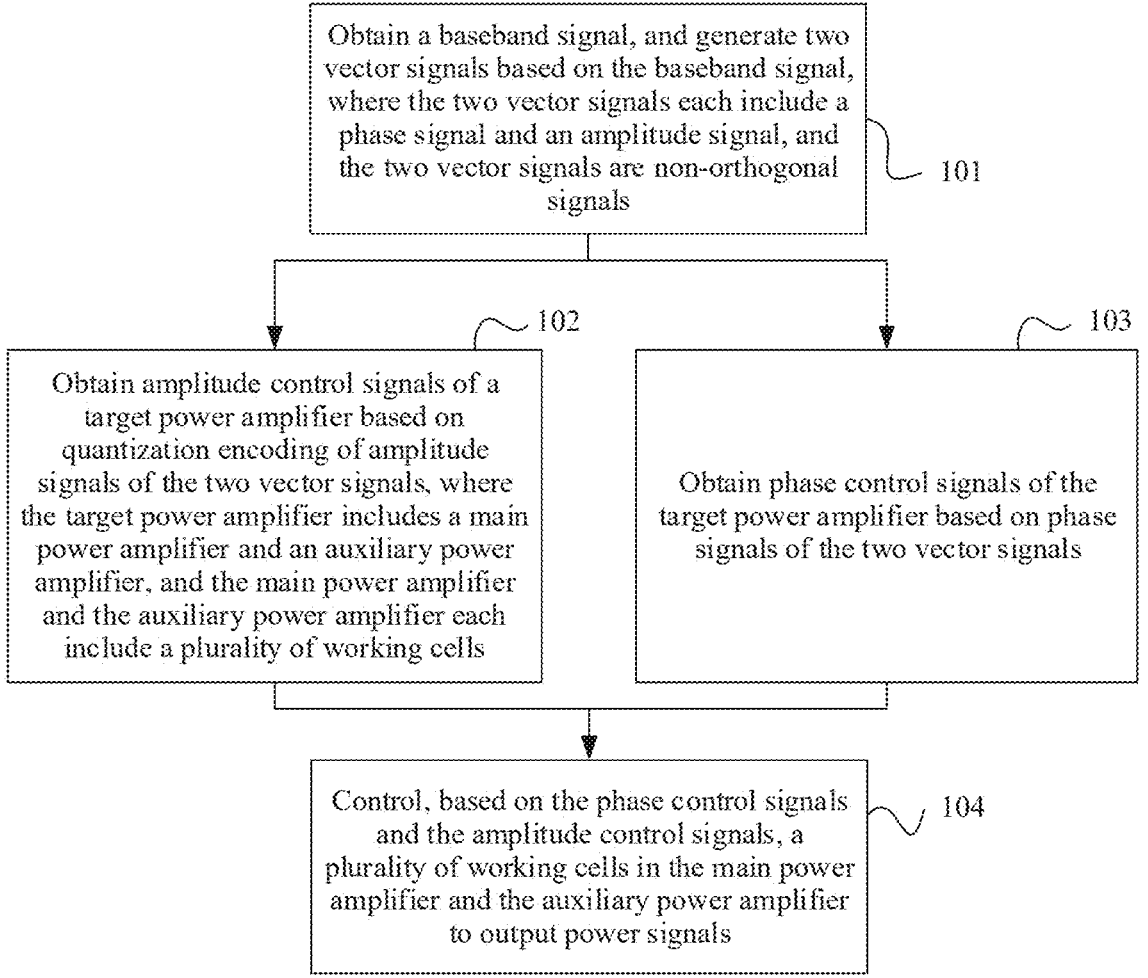

Obtain a baseband signal, and generate two vector signals based on the baseband signal, where the two vector signals each include a phase signal and an amplitude signal, and the two vector signals are non-orthogonal signals

101

Obtain amplitude control signals of a target power amplifier based on quantization encoding of amplitude signals of the two vector signals, where the target power amplifier includes a main power amplifier and an auxiliary power amplifier, and the main power amplifier and the auxiliary power amplifier each include a plurality of working cells

102

Obtain phase control signals of the target power amplifier based on phase signals of the two vector signals

103

Control, based on the phase control signals and the amplitude control signals, a plurality of working cells in the main power amplifier and the auxiliary power amplifier to output power signals

MULTI-PHASE-BASED DOHERTY POWER AMPLIFIER METHOD AND APPARATUS

CROSS-REFERENCE TO RELATED APPLICATIONS

This application is a continuation of International Application No. PCT/CN2021/091607, filed on Apr. 30, 2021, which claims priority to Chinese Patent Application No. 202010386745.1, filed on May 9, 2020. The disclosures of the aforementioned applications are hereby incorporated by reference in their entireties.

TECHNICAL FIELD

This application relates to the field of communication and electronic technologies, and in particular, to a multi-phase-based Doherty power amplifier method and apparatus.

BACKGROUND

Modem industry requires mass information and high-fidelity data transmission with high efficiency, intelligence, and a low delay. In addition, to meet a future requirement for a high data rate, a high-order broadband modulation signal is used, and consequently, a power amplifier of a transmitter works in a deep backoff region (5 dB to 20 dB). However, working efficiency of a conventional PA (power amplifier) in the deep backoff region is approximately less than 10%, and consequently, the conventional power amplifier cannot meet a requirement of a future transmitter system.

In the past decade, a digital power amplifier adjusts a transconductance (gm) by controlling an effective gate width, so that power of an output signal is modulated by a digital signal. In this way, a bottleneck that output power of the conventional power amplifier is restricted by input power is overcome, and a contradiction between efficiency and linearity of the power amplifier is resolved. A digital rectangular-coordinates power amplifier, a digital polar-coordinates power amplifier (including a Doherty digital polar-coordinates power amplifier and a class-G Doherty digital polar-coordinates power amplifier), a multi-phase technology, and the like are proposed and studied, to provide a potential solution for a digital power amplifier that adapts to the high-order broadband modulation signal. However, in an existing digital power amplifier, there is still a problem that performance such as efficiency and linearity of the power amplifier in the broadband modulation signal deteriorates.

SUMMARY

Embodiments of this application provide a multi-phase-based Doherty power amplifier method and apparatus, to resolve a problem that performance such as efficiency and linearity of a power amplifier in a broadband modulation signal deteriorates.

According to a first aspect, a multi-phase-based Doherty power amplifier method is provided, and the method includes: obtaining a baseband signal; generating two vector signals based on the baseband signal, where the two vector signals each include a phase signal and an amplitude signal, and the two vector signals are non-orthogonal signals; obtaining amplitude control signals of a target power amplifier based on quantization encoding of amplitude signals of the two vector signals, where the target power amplifier includes a main power amplifier and an auxiliary power amplifier, and the main power amplifier and the auxiliary power amplifier each include a plurality of working cells; obtaining phase control signals of the target power amplifier based on phase signals of the two vector signals; and controlling, based on the phase control signals and the amplitude control signals, a plurality of working cells in the main power amplifier and the auxiliary power amplifier to output power signals.

In a possible design, the amplitude signals corresponding to the two vector signals are $(\rho_1, \rho_2)$, and the amplitude control signals obtained based on quantization encoding of the amplitude signals include amplitude control signals (ACW1, ACW2) of the main power amplifier and amplitude control signals (ACW3, ACW4) of the auxiliary power amplifier.

In a possible design, the phase signals corresponding to the two vector signals are $(\phi_m, \phi_{m+1})$, and the phase control signals obtained based on the phase signals are $\cos(\omega_0 t + \varphi_m)$ and $\cos(\omega_0 t + \varphi_{m+1})$. $(\phi_m, \phi_{m+1})$ are selected from M non-orthogonal discrete phase bases $(\varphi_1, \ldots, \varphi_m, \varphi_{m+1}, \ldots, \varphi_M)$ based on the phase signals. M is an integer greater than 1, $1 \leq m < M$, and m is an integer.

In a possible design, the controlling, based on the phase control signals and the amplitude control signals, a plurality of working cells in the main power amplifier and the auxiliary power amplifier to output power signals includes: controlling, based on the phase control signals $\cos(\omega_0 t + \varphi_m)$ and $\cos(\omega_0 t + \varphi_{m+1})$ and the amplitude control signals (ACW1, ACW2) of the main power amplifier, a plurality of first working cells in the main power amplifier to output power signals, where the first working cell includes a plurality of main power amplifier units; and controlling, based on the phase control signals $\cos(\omega_0 t + \varphi_m)$ and $\cos(\omega_0 t + \varphi_{m+1})$ and the amplitude control signals (ACW3, ACW4) of the auxiliary power amplifier, a plurality of second working cells in the auxiliary power amplifier to output power signals, where the second working cell includes a plurality of auxiliary power amplifier units.

In a possible design, the plurality of first working cells include a first cell and a second cell, and the controlling a plurality of first working cells in the main power amplifier based on the phase control signals $\cos(\omega_0 t + \varphi_m)$ and $\cos(\omega_0 t + \varphi_{m+1})$ and the amplitude control signals (ACW1, ACW2) of the main power amplifier includes: separately controlling switching start locations of a plurality of main power amplifier units in the first cell and the second cell based on the phase base signals $\cos(\omega_0 t + \varphi_m)$ and $\cos(\omega_0 t + \varphi_{m+1})$; and separately controlling output power signals of a plurality of auxiliary power amplifier units in the first cell and the second cell based on the amplitude control signals ACW1 and ACW2 of the main power amplifier.

In a possible design, the plurality of second working cells include a third cell and a fourth cell, and the controlling a plurality of second working cells in the auxiliary power amplifier based on the phase control signals $\cos(\omega_0 t + \varphi_m)$ and $\cos(\omega_0 t + \varphi_{m+1})$ and the amplitude control signals (ACW3, ACW4) of the auxiliary power amplifier includes: separately controlling switching start locations of a plurality of auxiliary power amplifier units in the third cell and the fourth cell based on the phase base signals $\cos(\omega_0 t + \varphi_m)$ and $\cos(\omega_0 t + \varphi_{m+1})$; and separately controlling output power signals of a plurality of auxiliary power amplifier units in the third cell and the fourth cell based on the amplitude control signals ACW3 and ACW4 of the auxiliary power amplifier.

In this embodiment of this application, the main power amplifier and/or the auxiliary power amplifier in the target power amplifier are/is divided into working cells, and then output power of the working cells is separately controlled by using amplitude control signals obtained by using amplitude signals corresponding to two non-orthogonal vector signals, and switching start locations of the working cells are separately controlled by using phase control signals that are obtained based on the two vector signals and that are corresponding to adjacent phases, so that a cell sharing technology is not used to control the target power amplifier, more precise and accurate power control is implemented, and working efficiency of the target power amplifier is improved.

In a possible design, when the amplitude signal is less than a first preset threshold, the separately controlling output power signals of a plurality of main power amplifier units in the first cell and the second cell based on the amplitude control signals ACW1 and ACW2 of the main power amplifier includes: controlling the plurality of main power amplifier units in the first cell and the second cell to work at first power, where the first power is less than second power, and the second power is highest power in a low-voltage mode; and the separately controlling output power signals of a plurality of auxiliary power amplifier units in the third cell and the fourth cell based on the amplitude control signals ACW3 and ACW4 of the auxiliary power amplifier includes: controlling disabling of the plurality of auxiliary power amplifier units in the third cell and the fourth cell.

In a possible design, when the amplitude signal is less than a second preset threshold and is not less than the first preset threshold, the separately controlling output power signals of a plurality of main power amplifier units in the first cell and the second cell based on the amplitude control signals ACW1 and ACW2 of the main power amplifier includes: controlling the plurality of main power amplifier units in the first cell and the second cell to work at the second power; and the separately controlling output power signals of a plurality of auxiliary power amplifier units in the third cell and the fourth cell based on the amplitude control signals ACW3 and ACW4 of the auxiliary power amplifier includes: controlling the plurality of auxiliary power amplifier units in the third cell and the fourth cell to work at the first power.

In a possible design, when the amplitude signal is less than a third preset threshold and is not less than the second preset threshold, the separately controlling output power signals of a plurality of main power amplifier units in the first cell and the second cell based on the amplitude control signals ACW1 and ACW2 of the main power amplifier includes: controlling the plurality of main power amplifier units in the first cell and the second cell to work at third power, where the third power is greater than the second power and is less than fourth power, and the fourth power is highest power in a high-voltage mode; and the separately controlling output power signals of a plurality of auxiliary power amplifier units in the third cell and the fourth cell based on the amplitude control signals ACW3 and ACW4 of the auxiliary power amplifier includes: controlling the plurality of auxiliary power amplifier units in the third cell and the fourth cell to work at the second power.

In a possible design, when the amplitude signal is not less than a fourth preset threshold, the separately controlling output power signals of a plurality of main power amplifier units in the first cell and the second cell based on the amplitude control signals ACW1 and ACW2 of the main power amplifier includes: controlling the plurality of main power amplifier units in the first cell and the second cell to work at the fourth power; and the separately controlling output power signals of a plurality of auxiliary power amplifier units in the third cell and the fourth cell based on the amplitude control signals ACW3 and ACW4 of the auxiliary power amplifier includes: controlling the plurality of auxiliary power amplifier units in the third cell and the fourth cell to work at the third power.

In a possible design, at least one group in the amplitude control signals (ACW1, ACW2) and (ACW3, ACW4) are different control signals.

In this embodiment of this application, a class-G technology is combined with a multi-phase Doherty PA, so that the main power amplifier and the auxiliary power amplifier can be more accurately controlled in a more differentiated manner, and therefore, the power amplifier can output at least four different types of power, to adapt to different input power. In this way, amplification efficiency of the power amplifier is effectively improved.

In a possible design, after the generating two vector signals based on the baseband signal, the method further includes: performing non-linear compensation on the two vector signals to obtain updated phase signals and updated amplitude signals, where the updated phase signals are used to obtain the phase control signals of the target power amplifier, and the updated amplitude signals are used to perform quantization encoding to obtain the amplitude control signals of the target power amplifier.

In this embodiment of this application, power amplification is performed by using a class-G multi-phase Doherty PA. In one aspect, a plurality of working cells in the main power amplifier and the auxiliary power amplifier can be separately controlled by using a multi-phase technology, so that control accuracy and differentiation can be improved. With reference to the class-G technology, control differentiation can be further improved, so that a problem of low amplification efficiency that may be caused by the cell sharing technology is resolved, and working efficiency of the target power amplifier is improved.

According to a second aspect, an electronic apparatus is provided. The apparatus includes a signal processing module and an amplification module that are connected to each other. The signal processing module is configured to: obtain a baseband signal; and generate two vector signals based on the baseband signal, where the two vector signals each include a phase signal and an amplitude signal, and the two vector signals are non-orthogonal signals. The signal processing module is further configured to: obtain amplitude control signals of a target power amplifier based on quantization encoding of amplitude signals of the two vector signals, and obtain phase control signals of the target power amplifier based on phase signals of the two vector signals, where the target power amplifier includes a main power amplifier and an auxiliary power amplifier, and the main power amplifier and the auxiliary power amplifier each include a plurality of working cells. The amplification module is configured to: control, based on the phase control signals and the amplitude control signals, a plurality of working cells in the main power amplifier and the auxiliary power amplifier to output power signals.

In a possible design, the amplitude signals corresponding to the two vector signals are $(\rho_1, \rho_2)$, and the amplitude control signals obtained based on quantization encoding of the amplitude signals include amplitude control signals (ACW1, ACW2) of the main power amplifier and amplitude control signals (ACW3, ACW4) of the auxiliary power amplifier.

In a possible design, the phase signals corresponding to the two vector signals are $(\phi_m, \phi_{m+1})$, and the phase control signals obtained based on the phase signals are $\cos(w_0 t + \varphi_m)$ and $\cos(w_0t+\varphi_{m+1})$. The apparatus further includes a phase module connected to the signal processing module and the amplification module, and the phase module is configured to select phases $(\phi_m, \phi_{m+1})$ from M non-orthogonal discrete phase bases $(\varphi_1, \ldots, \varphi_m, \varphi_{m+1}, \ldots, \varphi_M)$ based on the phase signals. M is an integer greater than 1, $1 \le m < M$, and m is an integer.

In a possible design, the amplification module is specifically configured to: control, based on the phase control signals $\cos(\omega_0t+\varphi_m)$ and $\cos(\omega_0t+\varphi_{m+1})$ and the amplitude control signals (ACW1, ACW2) of the main power amplifier, a plurality of first working cells in the main power amplifier to output power signals, where the first working cell includes a plurality of main power amplifier units; and control, based on the phase control signals $\cos(\omega_0t+\varphi_m)$ and $\cos(\omega_0t+\varphi_{m+1})$ and the amplitude control signals (ACW3, ACW4) of the auxiliary power amplifier, a plurality of second working cells in the auxiliary power amplifier to output power signals, where the second working cell includes a plurality of auxiliary power amplifier units.

In a possible design, the plurality of first working cells include a first cell and a second cell, and the amplification module is specifically configured to: separately control switching start locations of a plurality of main power amplifier units in the first cell and the second cell based on the phase base signals $\cos(\omega_0t+\varphi_m)$ and $\cos(\omega_0t+\varphi_{m+1})$; and separately control output power signals of a plurality of auxiliary power amplifier units in the first cell and the second cell based on the amplitude control signals ACW1 and ACW2 of the main power amplifier.

In a possible design, the plurality of second working cells include a third cell and a fourth cell, and the amplification module is specifically configured to: separately control switching start locations of a plurality of auxiliary power amplifier units in the third cell and the fourth cell based on the phase base signals $\cos(\omega_0t+\varphi_m)$ and $\cos(\omega_0t+\varphi_{m+1})$; and separately control output power signals of a plurality of auxiliary power amplifier units in the third cell and the fourth cell based on the amplitude control signals ACW3 and ACW4 of the auxiliary power amplifier.

In a possible design, when the amplitude signal is less than a first preset threshold, the amplification module is specifically configured to: control the plurality of main power amplifier units in the first cell and the second cell to work at first power, where the first power is less than second power, and the second power is highest power in a low-voltage mode; and control disabling of the plurality of auxiliary power amplifier units in the third cell and the fourth cell.

In a possible design, when the amplitude signal is less than a second preset threshold and is not less than the first preset threshold, the amplification module is specifically configured to: control the plurality of main power amplifier units in the first cell and the second cell to work at the second power; and control the plurality of auxiliary power amplifier units in the third cell and the fourth cell to work at the first power.

In a possible design, when the amplitude signal is less than a third preset threshold and is not less than the second preset threshold, the amplification module is specifically configured to: control the plurality of main power amplifier units in the first cell and the second cell to work at third power, where the third power is greater than the second power and is less than fourth power, and the fourth power is highest power in a high-voltage mode; and control the plurality of auxiliary power amplifier units in the third cell and the fourth cell to work at the second power.

In a possible design, when the amplitude signal is not less than a fourth preset threshold, the amplification module is specifically configured to: control the plurality of main power amplifier units in the first cell and the second cell to work at the fourth power; and control the plurality of auxiliary power amplifier units in the third cell and the fourth cell to work at the third power.

In a possible design, at least one group in the amplitude control signals (ACW1, ACW2) and (ACW3, ACW4) are different control signals.

In a possible design, the signal processing module further includes a mapping module, configured to perform non-linear compensation on the two vector signals to obtain updated phase signals and updated amplitude signals, where the updated phase signals are used to obtain the phase control signals of the target power amplifier, and the updated amplitude signals are used to perform quantization encoding to obtain the amplitude control signals of the target power amplifier.

According to a third aspect, an electronic apparatus is provided. The apparatus includes at least one processor, and the at least one processor is coupled to at least one memory. The at least one processor is configured to execute a computer program or an instruction stored in the at least one memory, so that the apparatus performs the method according to any design of the first aspect.

The apparatus may be a terminal, or may be a chip included in the terminal. A function of the electronic apparatus may be implemented by using hardware, or may be implemented by executing corresponding software by using hardware. The hardware or the software includes one or more modules corresponding to the function.

According to a fourth aspect, an embodiment of this application provides a chip system, including a processor, where the processor is coupled to a memory, the memory is configured to store a program or an instruction, and when the program or the instruction is executed by the processor, the chip system is enabled to implement the method in the first aspect or any possible implementation of the first aspect.

Optionally, the chip system further includes an interface circuit, and the interface circuit is configured to exchange a code or an instruction with the processor.

Optionally, there may be one or more processors in the chip system, and the processor may be implemented by hardware or by software. When the processor is implemented by the hardware, the processor may be a logic circuit, an integrated circuit, or the like. When the processor is implemented by using the software, the processor may be a general-purpose processor, and is implemented by reading software code stored in the memory.

Optionally, there may also be one or more memories in the chip system. The memory may be integrated with the processor, or may be separated from the processor. This is not limited in this application. For example, the memory may be a non-transitory processor, for example, a read-only memory ROM. The memory and the processor may be integrated into a same chip, or may be separately disposed on different chips. A type of the memory and a manner of disposing the memory and the processor are not specifically limited in this application.

According to a fifth aspect, an embodiment of this application provides a computer-readable storage medium, and a computer program or an instruction is stored on the computer-readable storage medium. When the computer program or the instruction is executed, a computer is enabled to perform the method in the first aspect or any possible implementation of the first aspect.

According to a sixth aspect, an embodiment of this application provides a computer program product. When a computer reads and executes the computer program product, the computer is enabled to perform the method in the first aspect or any possible implementation of the first aspect.

BRIEF DESCRIPTION OF DRAWINGS

To describe the technical solutions in embodiments of this application or in the conventional technology more clearly, the following briefly describes the accompanying drawings for describing embodiments.

FIG. 3A is a flowchart of a multi-phase-based Doherty power amplifier control method according to an embodiment of this application;

DESCRIPTION OF EMBODIMENTS

The following describes technical solutions in embodiments of this application with reference to the accompanying drawings in embodiments of this application.

Technical solutions in embodiments of this application may be applied to various communication systems, such as a long-term evolution (LTE) system, an LTE frequency division duplex (FDD) system, an LTE time division duplex (TDD) system, a universal mobile telecommunications system (UMTS), a worldwide interoperability for microwave access (WiMAX) communication system, satellite communication, spatial communication, a 5th generation (5G) mobile communication system, a new wireless access technology (NR), or a future communication system such as a next-generation communication technology 6G.

Figure 1:
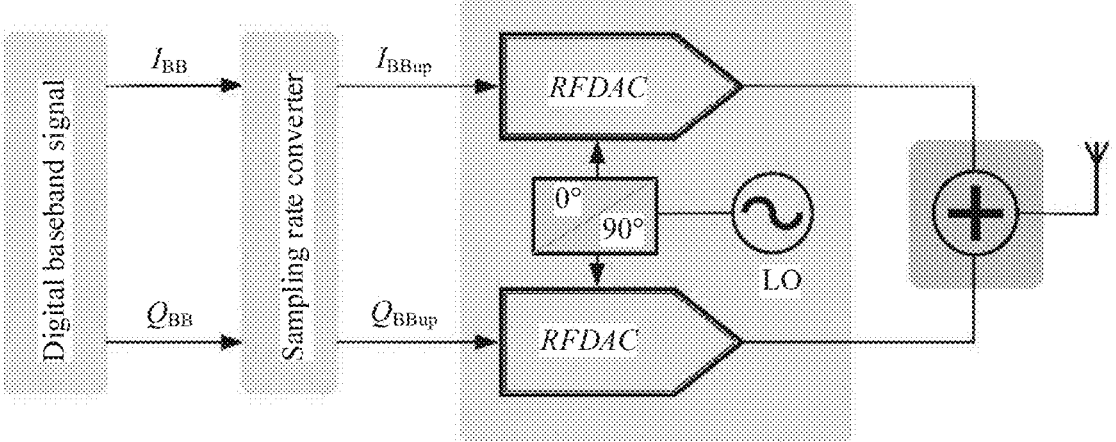
FIG. 1 is a block diagram of a system of a digital rectangular-coordinates power amplifier according to an embodiment of this application.
Figure 2:
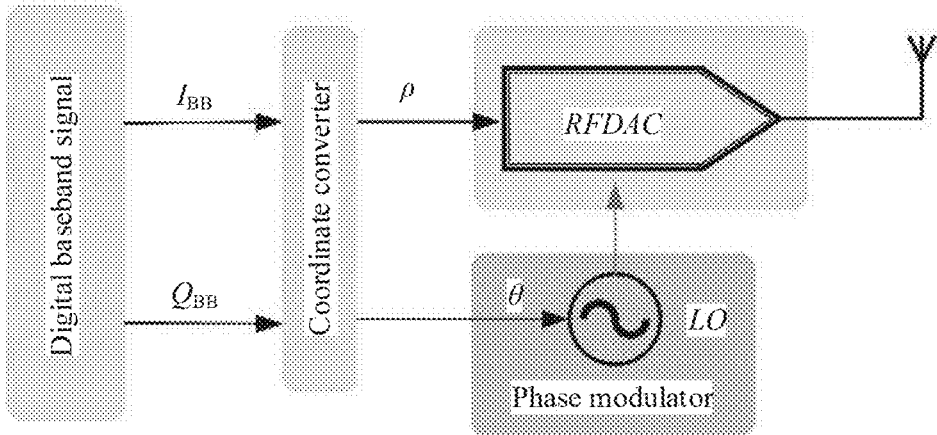
FIG. 2 is a block diagram of a system of a polar-coordinates power amplifier according to an embodiment of this application.

For ease of understanding of embodiments of this application, a digital power amplifier is first described with reference to FIG. 1 and FIG. 2.

To implement digitization and integration of a radio frequency front-end, a digital rectangular-coordinates power amplifier is proposed first. FIG. 1 is a block diagram of a system of a digital rectangular-coordinates power amplifier according to an embodiment of this application. As shown in FIG. 1, a baseband signal is represented by using an in-phase signal (in-phase) and a quadrature signal (quadrature) corresponding to the in-phase signal. After $I_{BB}/Q_{BB}$ passes through a rate converter, a signal frequency is increased to an intermediate frequency signal $I_{BBUP}/Q_{BBUP}$, and the intermediate frequency signal $I_{BBUP}/Q_{BBUP}$ and a local oscillator signal are separately input to a radio frequency digital-to-analog converter (RF-DAC, Radio Frequency Digital Analog Converter) unit, and power is finally combined and fed into an antenna. The digital rectangular-coordinates power amplifier naturally adapts to a broadband modulation signal, and has no signal alignment problem caused by bandwidth expansion. However, if the in-phase signal and the quadrature signal are combined into a radio frequency vector signal, there is inherent loss of 3 dB, and output power and efficiency are reduced. This problem is more obvious in a backoff region.

Appearance of a digital polar-coordinates power amplifier perfectly resolves the foregoing problem. FIG. 2 is a block diagram of a system of a power amplifier with polar coordinates according to an embodiment of this application. As shown in FIG. 2, a digital baseband signal $I_{BB}/Q_{BB}$ is converted into an envelope signal $\rho$ and a phase signal $\theta$ by using a coordinate converter. The envelope signal $\rho$ is quantized into an amplitude control word, and a phase modulator modulates the phase signal to a local oscillator signal. The envelope signal $\rho$ and a phase signal $\theta$ are separately input to an RF-DAC unit to generate a radio frequency vector signal with specific power. This avoids inherent saturation power loss of 3 dB during vector synthesis in a rectangular coordinate architecture, but a polar coordinate converter in a polar coordinate architecture causes severe bandwidth extension, and consequently, a phase signal of the broadband modulation signal needs an off-chip phase modulator with extremely wide bandwidth, and in addition, in the RF-DAC unit, it is difficult to align a wideband modulation phase signal with an amplitude signal.

It can be learned from the foregoing descriptions that, due to a high-order broadband modulation signal, a power amplifier in a transmitter always works in a deep backoff region (5 dB to 20 dB). However, working efficiency of a conventional power amplifier in the deep backoff region is only approximately 5% to 10%. To resolve a problem that a multi-phase digital power amplifier has large power dissipation and low efficiency in a backoff region, refer to FIG. 3A. FIG. 3A is a flowchart of a multi-phase-based Doherty power amplifier control method according to an embodiment of this application. As shown in FIG. 3A, the method includes the following steps:

101: Obtain a baseband signal, and generate two vector signals based on the baseband signal, where the two vector signals each include a phase signal and an amplitude signal, and the two vector signals are non-orthogonal signals.

102: Obtain amplitude control signals of a target power amplifier based on quantization encoding of amplitude signals of the two vector signals, where the target power amplifier includes a main power amplifier and an auxiliary power amplifier, and the main power amplifier and the auxiliary power amplifier each include a plurality of working cells.

103: Obtain phase control signals of the target power amplifier based on phase signals of the two vector signals.

104: Control, based on the phase control signals and the amplitude control signals, a plurality of working cells in the main power amplifier and the auxiliary power amplifier to output power signals. The power signal described herein is a signal transmitted at power amplified by a power amplifier. Details are not described below.

An original electrical signal that is sent by a signal source (an information source, also referred to as a transmit end) and that is not modulated (spectrum shift and conversion) is the baseband signal. The baseband signal has the following features: A frequency is relatively low, a signal spectrum starts near a zero frequency, and the baseband signal has a low-pass form.

The baseband signal may be represented by an I signal and a Q signal whose phases differ by 90° (are orthogonal), or may be represented by polar coordinates ρ, θ. Real-time signal decomposition and synthesis are performed by using the baseband signal to generate two non-orthogonal multi-phase vector signals, and corresponding phases are separately ($\phi_m$, $\phi_{m+1}$) and corresponding amplitudes are separately ($\rho_1$, $\rho_2$). If the baseband signal is an I signal and a Q signal, conversion is performed by using an algorithm for converting rectangular coordinates into a multi-phase vector signal. If the baseband signal is a ρ signal and a θ signal, conversion is performed by using an algorithm for converting polar coordinates into a multi-phase vector signal.

Figure 3B:
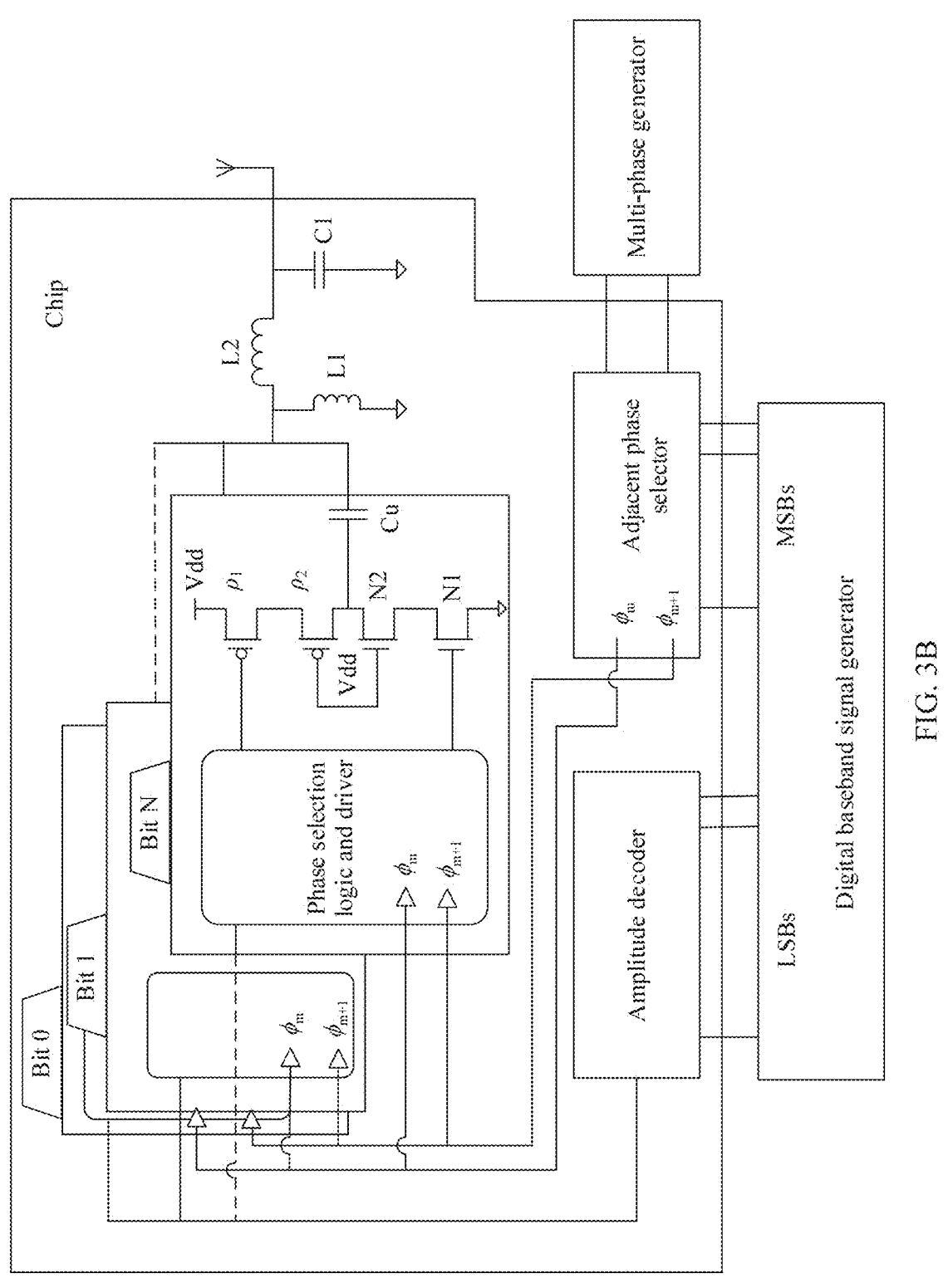
FIG. 3B is a schematic diagram of a multi-phase digital power amplifier according to an embodiment of this application.

FIG. 3B is a schematic diagram of a multi-phase digital power amplifier according to an embodiment of this application. As shown in FIG. 3B, a digital baseband signal is decomposed by using a vector to obtain two groups of signals ($\rho_1$, $\phi_m$) and ($\rho_2$, $\phi_{m+1}$). A working status of the power amplifier is controlled by using ($\rho_1$, $\phi_m$) and ($\rho_2$, $\phi_{m+1}$) and ($\rho_1$, $\phi_{m+1}$) and ($\rho_1$, $\phi_{m+1}$) are input to a load through a matching network and a power combining network. $\phi_m$ and $\phi_{m+1}$ are adjacent phase base signals. Therefore, phase modulation is converted into selection of intra-frequency multi-phase signals with adjacent phases (digital phase modulation). In a multi-phase technology, in combination with a polar coordinate technology and an out-of-phase technology, a problem of a limited broadband of a polar coordinate architecture and a problem of a vector synthesis saturation power loss of 3 dB of a rectangular coordinate architecture are overcome, and therefore the multi-phase technology becomes a favorable competitor in a digital power amplifier solution. However, due to a cell sharing technology, peak output power and peak efficiency of the digital power amplifier are relatively low, and in addition, efficiency of backoff at 6 dB is only approximately 15%, and there is still room to improve.

In addition, in a conventional technology, a power amplifier generally works in a backoff region of 5 dB to 20 dB. To improve backoff efficiency of a digital power amplifier, a Doherty technology is proposed to resolve a problem of power backoff. To be specific, a power amplifier includes both a main power amplifier (a main PA) and an auxiliary power amplifier (an auxiliary PA) that are alternatively referred to as a carrier power amplifier (a carrier PA) and a peak power amplifier (a peak PA). The main power amplifier may be a power amplifier that is biased on a class AB, works independently during input of a signal with low power, and works together with the auxiliary power amplifier during input of a signal with high power. The auxiliary power amplifier may be a power amplifier that is biased on a class B or a class C, and does not work during input of a signal with low power, and works during input of a signal with high power.

A polar-coordinates Doherty improves efficiency of the digital power amplifier in a backoff region of 6 dB. However, due to a problem such as poor broadband adaptability of a transmitter architecture, a current problem that efficiency of the power amplifier is low under the action of a high-order broadband modulation signal still cannot be resolved.

Based on this, an embodiment of this application provides a target digital power amplifier. The target digital power amplifier includes a main power amplifier and an auxiliary power amplifier, and at least one of the auxiliary power amplifier and the main power amplifier includes two or more working cells. For example, the main power amplifier includes two working cells, and the auxiliary power amplifier includes one working cell; alternatively, the main power amplifier includes one working cell, and the auxiliary power amplifier includes two working cells: alternatively, the main power amplifier includes two working cells, and the auxiliary power amplifier includes two working cells. The working cell may be a minimum set of power amplifier units. For example, one working cell in the main power amplifier includes 10 main power amplifier units, each main power amplifier unit is configured to perform carrier power amplification, and each main power amplifier unit may be controlled by a separate power supply switch and a separate power supply voltage, or a plurality of main power amplifier units may be correspondingly controlled by one common power supply switch and one common power supply voltage. The working cell may include another component such as a capacitor or a resistor.

Figure 3C:
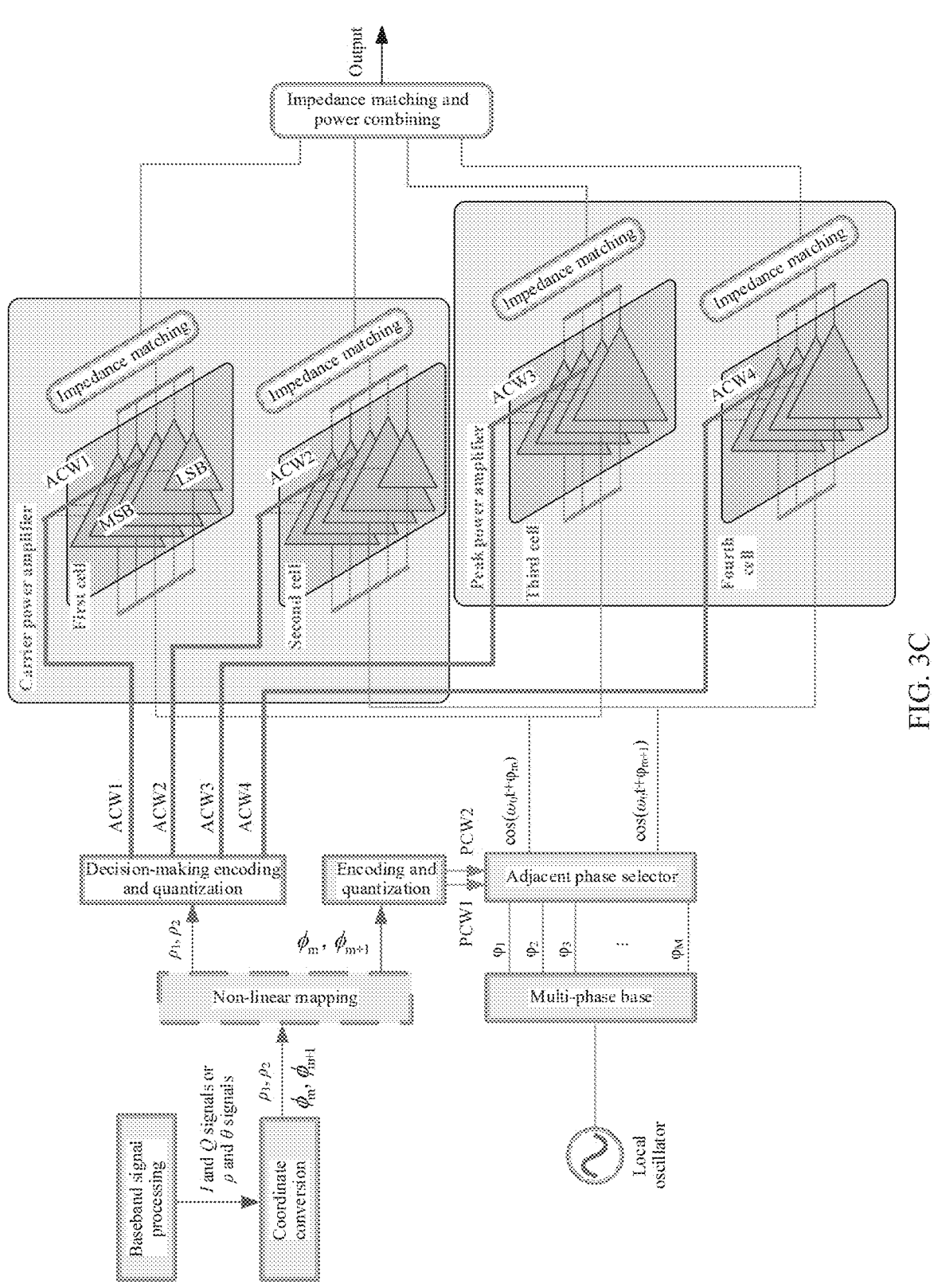
FIG. 3C is a schematic diagram of a multi-phase Doherty power amplifier according to an embodiment of this application.

FIG. 3C is a schematic diagram of a multi-phase Doherty power amplifier according to an embodiment of this application. As shown in FIG. 3C, a baseband signal includes an I signal and a Q signal or a polar coordinate signal, and is processed to generate two non-orthogonal multi-phase vector signals ($\rho_1$, $\phi_m$) and ($\rho_2$, $\phi_{m+1}$). Amplitude control words may be obtained through quantization encoding based on amplitude signals ($\rho_1$, $\rho_2$), for example, amplitude control words (ACW1, ACW2) are obtained based on $\rho_1$, and amplitude control words (ACW3, ACW4) are obtained based on $\rho_2$. A carrier power amplifier (the main power amplifier) includes two working cells: a first cell, cell 0, and a second cell, cell 1, and a peak power amplifier (an auxiliary power amplifier) includes two working cells: a third cell, cell 2, and a fourth cell, cell 3. ACW1 and ACW2 are used to control output power of the cell 0 and the cell 1, and ACW3 and ACW4 are used to control output power of the cell 2 and the cell 3.

The amplitude control word may be a group of encoded information. ACW1 is used as an example. It is assumed that ACW1 includes eight bits, and ACW1<2:0> at three lower bits, that is, a first bit, a second bit, and a third bit directly control an on/off state (on or off) of a least significant bit (LSB) main power amplifier unit in the cell 0, and corresponds to different output power, and ACW1<7:6> and ACW1<5:3> cooperatively control an on/off state of a most significant bit (MSB) main power amplifier unit in the cell 0, and corresponds to different output power. In addition, an LSB can correspond to a maximum of $2^3=8$ on states, and an MSB can correspond to a maximum of $2=32$ on states. For example, the cell 0 includes eight LSB main power amplifier units and 32 MSB main power amplifier units. A relationship between a value of ACW1<2:0> and an LSB on/off state is shown in Table 1-1.

TABLE 1-1

| Value of ACW1<2:0> | LSB on/off state |
|---|---|
| 000 | 10,000,000 |
| 001 | 01,000,000 |
| 010 | 00,100,000 |
| 011 | 00,010,000 |
| 100 | 00,001,000 |
| 101 | 00,000,100 |
| 110 | 00,000,010 |
| 111 | 00,000,001 |

A multi-phase Doherty power amplifier (PA) shown in FIG. 3C may preset a correspondence between a value of three lower bits of ACW1 and an LSB on/off state in the cell 0, and then determine output power of the LSB based on an obtained value of ACW1. LSB on/off states are distinguished based on a bit value "0" or "1" in Table 1-1. It is assumed that ACW1<2:0>=(001), and an on/off state of the LBS main power amplifier unit is (01,000,000). This indicates that a second LSB main power amplifier unit in the cell 0 is enabled and another LSB main power amplifier unit is disabled, and the power amplifier performs output based on corresponding power. Alternatively, (01,000,000) may indicate that a second LSB main power amplifier unit in the cell 0 is disabled and another LSB main power amplifier unit is enabled. The second LSB main power amplifier unit may be determined based on a unit identifier or number, or is determined based on a unit arrangement sequence in the cell 0.

In an optional case, a correspondence between a value of ACW1<2:0> and an LSB on/off state is shown in Table 1-2.

TABLE 1-2

| Value of ACW1<2:0> | LSB on/off state |
| --- | --- |
| 000 | 00,000,000 |
| 001 | 01,001,000 |
| 010 | 00,101,100 |
| 011 | 00,110,110 |
| 100 | 10,111,001 |
| 101 | 11,100,111 |
| 110 | 11,111,110 |
| 111 | 11,111,111 |

It may be learned based on Table 1-2 that, if it is assumed that ACW1<2:0>=(001), and an on/off state of the LBS main power amplifier unit is (01,001,000), it indicates that any two LSB main power amplifier units in the cell 0 are enabled and another LSB main power amplifier unit is disabled, and the power amplifier performs output based on corresponding power. Alternatively, it may indicate that any two LSB main power amplifier units in the cell 0 are disabled and another LSB main power amplifier unit is enabled. Similarly, ACW1<2:0>=(000) indicates that all LSB main power amplifier units are enabled or disabled, and ACW1<2:0>= (111) indicates that all LSB main power amplifier units are disabled or enabled.

Similarly, a correspondence between a value of a remaining bit of ACW1 and an MSB enabled state in the cell 0 may also be set, and then output power of the MSB is determined based on an obtained value of ACW1. Output power of the cell 1, the cell 2, and the cell 3 may also be determined based on ACW2, ACW3, and ACW4 in a same manner.

In addition, as shown in FIG. 3C, the phase signals corresponding to the two vector signals are ($\phi_m$, $\phi_{m+1}$), and quantization encoding is performed based on the two phase signals to obtain phase control words (PCW1, PCW2); M non-orthogonal discrete phase bases ($\varphi_1$, . . . , $\varphi_m$, $\varphi_{m+1}$, . . . , $\varphi_M$) may be obtained after a local oscillator signal is modulated; and adjacent phases ($\varphi_M$, $\varphi_{m+1}$) may be obtained from the M non-orthogonal discrete phase bases based on the phase control words (PCW1, PCW2). M is an integer greater than 1, $1 \leq m < M$. and m is an integer. A phase spacing of every two adjacent phases is $2\pi/M$. or the M non-orthogonal discrete phase bases may alternatively not be equally divided. It is easy to equally divide the spacing, and it is relatively flexible to unequally divide the spacing.

The two manners have respective advantages. This is not limited in this embodiment of this application.

After the adjacent phases ($\varphi_M$, $\varphi_{m+1}$) are selected, phase control signals $\cos(\omega_0 t + \varphi_m)$ and $\cos(\omega_0 t + \varphi_{+1})$ are generated. $\cos(\omega_0 t + \varphi_m)$ is used to control switching start locations of a plurality of main power amplifier units in the cell 0 and switching start locations of a plurality of auxiliary power amplifier units in the cell 2, and $\cos(\omega_0 t + \varphi_{m+1})$ is used to control switching start locations of a plurality of main power amplifier units in the cell 1 and switching start locations of a plurality of auxiliary power amplifier units in the cell 3. For example, the phase control signal $\cos(\omega_0 t + \varphi_m)$ indicates that a switching start location in a controlled power amplifier unit is advanced by $\varphi_m/\omega_0$ compared with a switching start location controlled by $\cos(\omega_0 t)$.

In an optional case, the two non-orthogonal vector signals have a non-linear feature. Therefore, based on a non-linear mapping table, non-linear compensation may be separately performed on generated phase signals ($\phi_m$, $\phi_{m+1}$) and amplitude signals ($\rho_1$, $\rho_2$) of the two signals, to obtain updated phase signals, and quantization encoding is performed by using the updated phase signals and updated amplitude signals to obtain a corresponding amplitude control word and a corresponding phase control signal, so that the main power amplifier and the auxiliary power amplifier are controlled.

It may be learned that, in this embodiment of this application, the main power amplifier and/or the auxiliary power amplifier in the target power amplifier are/is divided into working cells, and then output power of the working cells is separately controlled by using amplitude control signals obtained by using amplitude signals corresponding to two non-orthogonal vector signals, and switching start locations of the working cells are separately controlled by using phase control signals that are obtained based on the two vector signals and that are corresponding to adjacent phases, so that a cell sharing technology is not used to control the target power amplifier, more precise and accurate power control is implemented, and working efficiency of the target power amplifier is improved.

In addition, at least one group in (ACW1, ACW2) and (ACW3. ACW4) in the foregoing descriptions is different control signals: in other words, at least one of ACW1≠ACW2 and ACW3≠ACW4 is valid. If ACW1=ACW2 and ACW3=ACW4, it indicates that amplitude control words corresponding to the cell 0 and the cell 1 are the same, amplitude control words corresponding to the cell 2 and the cell 3 are the same, control results for main power amplifier units in the cell 0 and the cell 1 are the same, and control results for auxiliary power amplifier units in the cell 2 and the cell 3 are the same. This is equivalent to that the main power amplifier and the auxiliary power amplifier are not divided into cells. Therefore, a problem of low working power of the amplifier caused by the cell sharing technology cannot be resolved.

In addition, a 1-bit amplitude modulation technology combined with a Doherty technology is introduced into the digital power amplifier, and the 1-bit amplitude modulation technology corresponds to a class-G power amplifier, or may be a power amplifier of another type. A backoff region efficiency enhancement interval is expanded by using a power supply modulation technology and an active load traction technology. When power backs off to 0 to 6 dB, Vdd power supply is performed for both the main power amplifier and the auxiliary power amplifier, to form a Vdd mode Doherty. When power backs off to 6 dB to 12 dB, Vdd/2 power supply is performed for both the main power amplifier and the auxiliary power amplifier, to form a Vdd/2 mode Doherty. However, because all power supply voltages are switched at the same time during backoff to 6 dB, an the auxiliary power amplifier, so that a correspondence between the working mode, the output power, and an amplitude value may be determined, as shown in Table 2.

TABLE 2

| Amplitude signal $\rho = (\rho_1, \rho_2)$ | Working mode | Output power |
| --- | --- | --- |
| $\rho$ < First preset threshold | The first cell and the second cell are in a low-voltage partially-enabled mode, and the third cell and the fourth cell are disabled | Main power amplifier: First power |
| First preset threshold $\le$ $\rho$ < Second preset threshold | The first cell and the second cell are in a low-voltage entirely-enabled mode, and the third cell and the fourth cell are in a low-voltage partially-enabled mode | Main power amplifier: Second power Auxiliary power amplifier: First power |
| Second preset threshold $\le$ $\rho$ < Third preset threshold | The first cell and the second cell are in a medium-high-voltage partially-enabled mode, and the third cell and the fourth cell are in a low-voltage entirely-enabled mode | Main power amplifier: Third power Auxiliary power amplifier: Second power |
| $\rho \le$ Fourth preset threshold | The first cell and the second cell are in a high-voltage entirely-enabled mode, and the third cell and the fourth cell are in a high-voltage partially-enabled mode | Main power amplifier: Fourth power Auxiliary power amplifier: Third power | extremely large positive/negative peak pulse is generated, and this greatly deteriorates linearity of a broadband modulation signal. In addition, due to performance degradation caused by bandwidth expansion of a polar coordinate (Polar) architecture, a polar class-G Doherty digital power amplifier cannot obtain high performance in the broadband modulation signal.

In this embodiment of this application, the 1-bit amplitude modulation technology is combined with the multi-phase Doherty PA shown in FIG. 3C. The 1-bit amplitude modulation technology is, for example, a class-G power amplifier, and a class-G multi-phase Doherty PA is formed. A carrier power amplifier and a peak power amplifier each include a plurality of working cells, each working cell of the carrier power amplifier includes a plurality of main power amplifier units, and each working cell of the peak power amplifier includes a plurality of auxiliary power amplifier units. The amplitude control signals (ACW1, ACW2) and (ACW3, ACW4) obtained based on the two vector signals may further include a field used to control a working mode of the main power amplifier unit or the auxiliary power amplifier unit in the plurality of working cells, and the working mode includes a class-G working mode.

The amplitude signals corresponding to the two vector signals are $\rho_1$ and $\rho_2$, quantization encoding is performed based on $\rho_1$ to obtain amplitude control words (ACW1, ACW2), and amplitude control words (ACW3, ACW4) are obtained based on $\rho_2$. A value of $\rho_1$ may be used to control output power of the main power amplifier, and a value of $\rho_2$ may be used to control output power of the auxiliary power amplifier. In addition, the amplitude signal and the output power are in a proportional relationship. A larger value of the amplitude signal indicates larger output power.

When the multi-phase Doherty PA supports the class-G working mode, a magnitude of the amplitude signal further determines working modes of the main power amplifier and In the foregoing table, "=" may be combined with "<", or may be combined with ">"; in other words, "$\le$" may be replaced with "<", and "greater than" may be replaced with "$\ge$".

When the amplitude signal is between the first preset threshold and the second preset threshold, because a value of the amplitude signal is small, only some main power amplifier units in the cell 0 and the cell 1 can be activated to work in a low-voltage mode, and the auxiliary power amplifier units in the cell 2 and the cell 3 are in a disabled state. When the amplitude signal is between the first preset threshold and the second preset threshold, all the main power amplifier units in the cell 0 and the cell 1 work in the low-voltage mode, corresponding second output power is maximum power in the low-voltage mode, and the auxiliary power amplifier units in the cell 1 and the cell 2 work in a partial low-voltage mode. When the amplitude signal is greater than the fourth preset threshold, because a value of the amplitude signal is large, both the first cell and the second cell work in a high-voltage mode, and corresponding fourth output power is maximum output power in the high-voltage mode. Then, the amplitude control signal ACW1 of the cell 0 is used as an example. It is assumed that ACW1 includes 10 bits, and lower eight bits are used to indicate an enabled state of the main power amplifier unit in the cell 0, higher two bits are used to indicate a working mode of the main power amplifier unit in the cell 0, and a correspondence between a value of ACW1<9:8> and a working mode may be shown in Table 3.

TABLE 3

| Value of ACW1<9:8> | Working mode |
| --- | --- |
| 00 | Partial low-voltage working mode and partial disabled mode |
| 01 | Low-voltage entirely-enabled mode |

TABLE 3-continued

| Value of ACW1<9:8> | Working mode |
|---|---|
| 10 | Partial low-voltage working mode and partial high-voltage working mode |
| 11 | High-voltage entirely-enabled mode |

It is assumed that ACW1=00XXXXX110, and an amplitude control word at three lower bits corresponding to the LBS is 110, and this indicates that an on/off state corresponding to eight LBS main power amplifier units is (00, 000,010), and ACW1<9:8>=00 indicates that the main power amplifier units in the first cell are in a partial low-voltage working mode and a partially-disabled mode. Therefore, eight LBSs in the cell 0 in Table 1-1 may be LBSs whose on/off state identifier fields are 1. To be specific, a seventh main power amplifier unit works in the low-voltage mode, and remaining seven main power amplifier units are disabled; or a seventh main power amplifier unit may be disabled, and remaining seven main power amplifier units work in the low-voltage mode.

The main power amplifier and the auxiliary power amplifier each include two working cells. When the class-G technology is not used, a correspondence between a working mode of each working cell in the main power amplifier and a working mode of each working cell in the auxiliary power amplifier is shown in Table 4-1.

TABLE 4-1

| Working cell in the main power amplifier-Working mode | Working cell in the auxiliary power amplifier-Working mode |
|---|---|
| Entirely enabled | Partially enabled |
| Partially enabled | Entirely disabled |

Similar to Table 3, the working modes of the working cell in the main power amplifier and the working cell in the auxiliary power amplifier in Table 4-1 may also be indicated in an index form. For example, I bit in the amplitude control word may be used to represent the working mode of the working cell. For the working cell in the main power amplifier, 1 indicates the entirely-enabled mode, 0 indicates the partially-enabled mode, and default indicates the entirely-disabled mode. For the auxiliary power amplifier, 1 indicates partially-enabled. 0 indicates entirely-disabled, and default indicates entirely-enabled. The main power amplifier and the auxiliary power amplifier may be jointly represented by one bit, or may be separately represented by one bit.

It can be learned from the foregoing descriptions that, the class-G technology is combined with the multi-phase Doherty PA, so that a plurality of signals control power amplifier units to perform power amplification in different working modes. A correspondence between a working mode of each working cell in the main power amplifier and a working mode of each working cell in the auxiliary power amplifier is shown in Table 4-2.

TABLE 4-2

| Working cell in the main power amplifier-Working mode | Working cell in the auxiliary power amplifier-Working mode |
|---|---|
| Partial low-voltage working mode and partial disabled mode | Entirely disabled |

TABLE 4-2-continued

| Working cell in the main power amplifier-Working mode | Working cell in the auxiliary power amplifier-Working mode |
|---|---|
| Low-voltage entirely-enabled mode | Partial low-voltage working mode and partial disabled mode |
| Partial low-voltage working mode and partial high-voltage working mode | Low-voltage entirely-enabled mode |
| High-voltage entirely-enabled mode | Partial low-voltage working mode and partial high-voltage working mode |

Similar to Table 3, the working modes of the working cell in the main power amplifier and the working cell in the auxiliary power amplifier in Table 4-2 may also be indicated in an index form. For example, two bits in the amplitude control word may be used to indicate the working mode of the working cell in the main power amplifier, 00 indicates the partial low-voltage working mode and the partially-disabled mode, 01 indicates the low-voltage entirely-enabled mode, 10 indicates the partial low-voltage working mode and the partial high-voltage working mode, and 11 indicates the high-voltage entirely-enabled mode. For the working mode of the working cell in the auxiliary power amplifier, 00 indicates the entirely-disabled mode, 01 indicates the partial low-voltage working mode and the partially-disabled mode, 10 indicates the low-voltage entirely-enabled mode, and 11 indicates the partial low-voltage working mode and the partial high-voltage working mode. The main power amplifier and the auxiliary power amplifier may be jointly represented by two bits, or may be separately represented by two bits.

It may be learned that, the class-G technology is combined with the multi-phase Doherty PA, so that the main power amplifier and the auxiliary power amplifier can be more accurately controlled in a more differentiated manner, and therefore, the power amplifier can output at least four different types of power, to adapt to different input power. In this way, amplification efficiency of the power amplifier is effectively improved.

In this embodiment of this application, power amplification is performed by using the class-G multi-phase Doherty PA. In one aspect, a plurality of working cells in the main power amplifier and the auxiliary power amplifier can be separately controlled by using the multi-phase technology, so that control accuracy and differentiation can be improved. With reference to the class-G technology, control differentiation can be further improved, so that a problem of low amplification efficiency that may be caused by the cell sharing technology is resolved, and working efficiency of the target power amplifier is improved.

Figure 4:
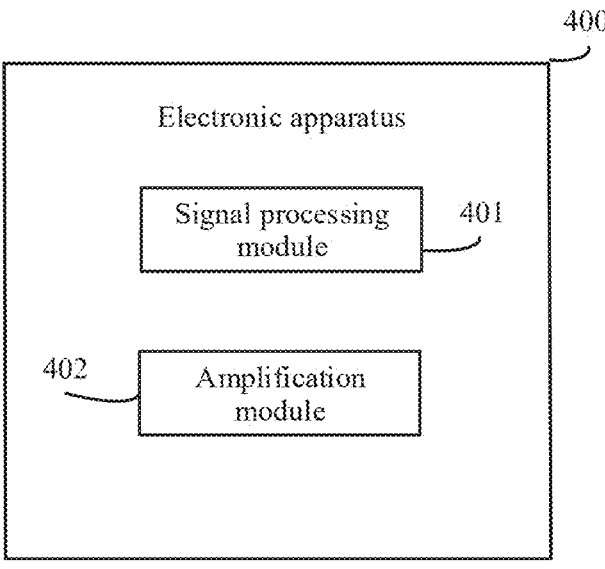
FIG. 4 is a block diagram of a structure of an electronic apparatus according to an embodiment of this application.

FIG. 4 shows an electronic apparatus 400 provided in an embodiment of this application. The electronic apparatus 400 may be configured to perform the method performed by the power amplifier in the embodiment corresponding to FIG. 3A to FIG. 3C, and the electronic apparatus may be a terminal device or may be a chip configured in the terminal device. The terminal device includes a signal processing module 401 and an amplification module 402.

The signal processing module 401 is configured to: obtain a baseband signal, and generate two vector signals based on the baseband signal, where the two vector signals each include a phase signal and an amplitude signal, and the two vector signals are non-orthogonal signals.

The signal processing module 401 is further configured to obtain amplitude control signals of a target power amplifier based on quantization encoding of amplitude signals of the two vector signals, and obtain phase control signals of the target power amplifier based on phase signals of the two vector signals, where the target power amplifier includes a main power amplifier and an auxiliary power amplifier, and the main power amplifier and the auxiliary power amplifier each include a plurality of working cells.

The amplification module 402 is configured to control, based on the phase control signals and the amplitude control signals, a plurality of working cells in the main power amplifier and the auxiliary power amplifier to output power signals.

Optionally, the amplification module 402 is specifically configured to: control, based on the phase control signals $\cos(\omega_0 t+\varphi_m)$ and $\cos(\omega_0 t+\varphi_{m+1})$ and the amplitude control signals (ACW1, ACW2) of the main power amplifier, a plurality of first working cells in the main power amplifier to output power signals, where the first working cell includes a plurality of main power amplifier units; and control, based on the phase control signals $\cos(\omega_0 t+\varphi_m)$ and $\cos(\omega_0 t+\varphi_{m+1})$ and the amplitude control signals (ACW3, ACW4) of the auxiliary power amplifier, a plurality of second working cells in the auxiliary power amplifier to output power signals, where the second working cell includes a plurality of auxiliary power amplifier units.

Optionally, the plurality of first working cells include a first cell and a second cell, and the amplification module 402 is specifically configured to:

separately control switching start locations of a plurality of main power amplifier units in the first cell and the second cell based on the phase base signals $\cos(\omega_0 t+\varphi_m)$ and $\cos(\omega_0 t+\varphi_{m+1})$; and separately control output power signals of a plurality of auxiliary power amplifier units in the first cell and the second cell based on the amplitude control signals ACW1 and ACW2 of the main power amplifier.

Optionally, the plurality of second working cells include a third cell and a fourth cell, and the amplification module 402 is specifically configured to:

separately control switching start locations of a plurality of auxiliary power amplifier units in the third cell and the fourth cell based on the phase base signals $\cos(\omega_0 t+\varphi_m)$ and $\cos(\omega_0 t+\varphi_{m+1})$; and separately control output power signals of a plurality of auxiliary power amplifier units in the third cell and the fourth cell based on the amplitude control signals ACW3 and ACW4 of the auxiliary power amplifier.

When the amplitude signal is less than a first preset threshold, the amplification module 402 is specifically configured to:

control the plurality of main power amplifier units in the first cell and the second cell to work at first power, where the first power is less than second power, and the second power is highest power in a low-voltage mode; and control disabling of the plurality of auxiliary power amplifier units in the third cell and the fourth cell.

Optionally, when the amplitude signal is less than a second preset threshold and is not less than the first preset threshold, the amplification module 402 is specifically configured to:

control the plurality of main power amplifier units in the first cell and the second cell to work at the second power; and control the plurality of auxiliary power amplifier units in the third cell and the fourth cell to work at the first power.

Optionally, when the amplitude signal is less than a third preset threshold and is not less than the second preset threshold, the amplification module 402 is specifically configured to:

control the plurality of main power amplifier units in the first cell and the second cell to work at third power, where the third power is greater than the second power and is less than fourth power, and the fourth power is highest power in a high-voltage mode; and control the plurality of auxiliary power amplifier units in the third cell and the fourth cell to work at the second power.

Optionally, when the amplitude signal is not less than a fourth preset threshold, the amplification module 402 is specifically configured to:

control the plurality of main power amplifier units in the first cell and the second cell to work at the fourth power; and control the plurality of auxiliary power amplifier units in the third cell and the fourth cell to work at the third power.

Figure 5:
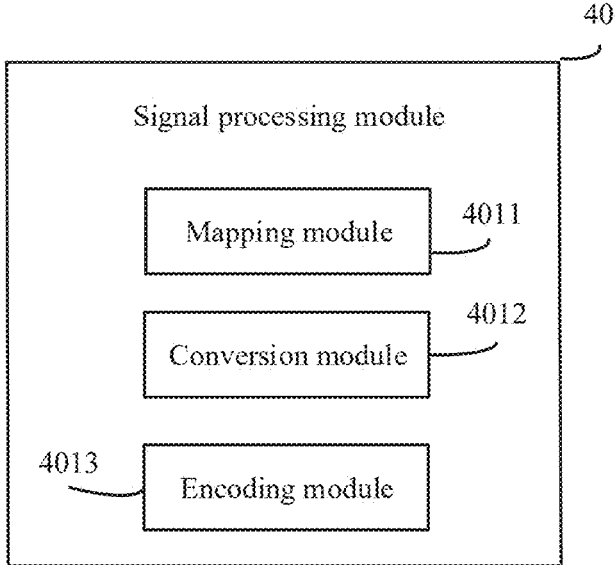
FIG. 5 is a block diagram of a structure of a signal processing module of an electronic apparatus according to an embodiment of this application.

Optionally, FIG. 5 is a block diagram of a structure of the signal processing module according to an embodiment of this application. As shown in FIG. 5, the signal processing module 401 further includes a mapping module 4011, configured to:

perform non-linear compensation on the two vector signals to obtain updated phase signals and updated amplitude signals, where the updated phase signals are used to obtain the phase control signals of the target power amplifier, and the updated amplitude signals are used to perform quantization encoding to obtain the amplitude control signals of the target power amplifier.

Optionally, the signal processing module 401 further includes a conversion module 4012 and an encoding module 4013. The conversion module 4012 is configured to: obtain a baseband signal, and generate two vector signals based on the baseband signal. The encoding module 4013 is configured to obtain amplitude control signals of a target power amplifier based on quantization encoding of amplitude signals of the two vector signals, and obtain phase control signals of the target power amplifier based on phase signals of the two vector signals.

Optionally, the signal processing module 401 and the amplification module 402 may be chips, encoders, encoding circuits, or other integrated circuits that can implement the method in this application.

Optionally, the apparatus 400 may further include a storage module (not shown in the figure). The storage module may be configured to store data and/or signaling. The storage module may be coupled to the signal processing module 401 and the amplification module 402. For example, the signal processing module 401 or the amplification module 402 may be configured to read the data and/or the signaling in the storage module, so that the control method in the foregoing method embodiments is performed.

Figure 6:
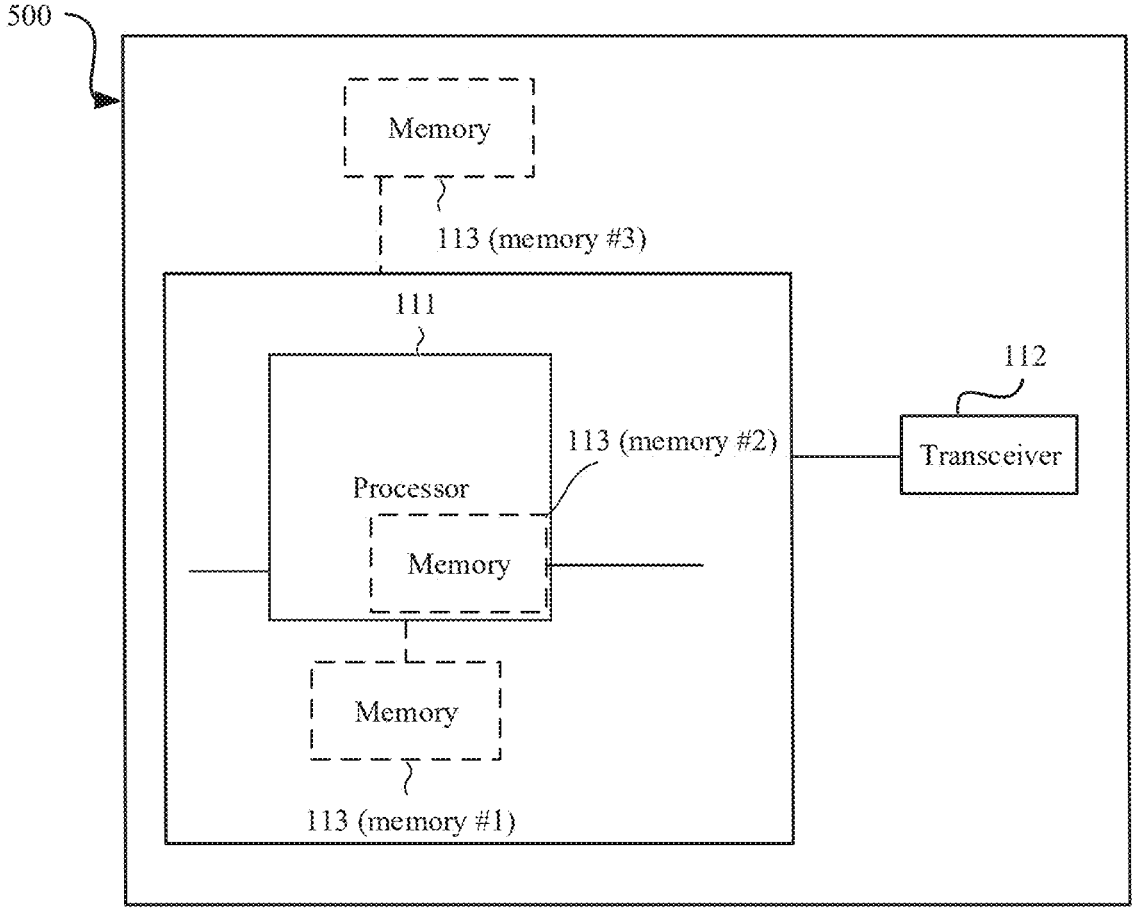
FIG. 6 is a schematic diagram of a hardware structure of an electronic apparatus according to an embodiment of this application.

FIG. 6 is a schematic diagram of a hardware structure of an electronic apparatus according to an embodiment of this application. For a structure of a power amplifier, refer to the structure shown in FIG. 6. An electronic apparatus 500 includes a processor 111 and a memory 113, and the processor 111 is electrically coupled to the memory 113.

The processor 111 is configured to execute some or all computer program instructions in the memory, and when some or all of the computer program instructions are executed, the apparatus is enabled to perform the method in any one of the foregoing embodiments.

Optionally, the apparatus further includes a memory 113, configured to store a computer program instruction. Optionally, the memory 113 (a memory #1) is located in the apparatus, and the memory 113 (a memory #2) is integrated with the processor 111, or the memory 113 (a memory #3) is located outside the apparatus.

Optionally, the apparatus 500 further includes a transceiver 112, configured to communicate with another device.

It should be understood that the electronic apparatus 500 shown in FIG. 6 may be a chip or a circuit. For example, the electronic apparatus 500 may be a chip or a circuit disposed in a terminal apparatus or an electronic apparatus. The transceiver 112 may alternatively be a communication interface. The transceiver includes a receiver and a transmitter. Further, the electronic apparatus 500 may further include a bus system.

The processor 111, the memory 113, and the transceiver 112 are connected by using the bus system. The processor 111 is configured to execute the instruction stored in the memory 113, to control the transceiver to receive a signal and send a signal, and complete steps of a first device or a second device in the implementation method related to this application. The memory 113 may be integrated into the processor 111, or may be separated from the processor 111.

In an implementation, a function of the transceiver 112 may be implemented by using a transceiver circuit or a transceiver-specific chip. The processor 111 may be implemented by using a dedicated processing chip, a processing circuit, a processor, or a general-purpose chip. The processor may be a central processing unit (CPU), a network processor (NP), or a combination of a CPU and an NP. The processor may further include a hardware chip or another general-purpose processor. The hardware chip may be an application-specific integrated circuit (ASIC), a programmable logic device (PLD), or a combination thereof. The PLD may be a complex programmable logic device (CPLD), a field-programmable gate array (FPGA), generic array logic (GAL) or another programmable logic device, a discrete gate or a transistor logic device, a discrete hardware component, or any combination thereof. The general-purpose processor may be a microprocessor, or the processor may be any conventional processor or the like.

It may be further understood that the memory mentioned in embodiments of this application may be a volatile memory or a non-volatile memory, or may include a volatile memory and a non-volatile memory. The non-volatile memory may be a read-only memory (ROM), a programmable read-only memory (Programmable ROM, PROM), an erasable programmable read-only memory (Erasable PROM, EPROM), an electrically erasable programmable read-only memory (Electrically EPROM, EEPROM), or a flash memory. The volatile memory may be a random access memory (RAM) and is used as an external cache. Through example but not limitative description, many forms of RAMs may be used, for example, a static random access memory (Static RAM, SRAM), a dynamic random access memory (Dynamic RAM, DRAM), a synchronous dynamic random access memory (Synchronous DRAM, SDRAM), a double data rate synchronous dynamic random access memory (Double Data Rate SDRAM, DDR SDRAM), an enhanced synchronous dynamic random access memory (Enhanced SDRAM, ESDRAM), a synchlink dynamic random access memory (Synchlink DRAM, SLDRAM), and a direct rambus random access memory (Direct Rambus RAM, DR RAM). It should be noted that the memory described in this specification is intended to include but not limited to these memories and any memory of another appropriate type.

An embodiment of this application provides a computer storage medium. The computer storage medium stores a computer program, and the computer program includes a method corresponding to the power amplifier in the foregoing embodiments.

An embodiment of this application provides a computer program product that includes instructions. When the computer program product is run on a computer, the computer is enabled to perform a method corresponding to the power amplifier in the foregoing embodiments.

It should be understood that sequence numbers of the foregoing processes do not mean execution sequences in embodiments of this application. The execution sequences of the processes should be determined based on functions and internal logic of the processes, and should not constitute any limitation on implementation processes of embodiments of this application.

A person of ordinary skill in the art may be aware that, in combination with the examples described in embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and unit, refer to a corresponding process in the foregoing method embodiments. Details are not described herein again.

In several embodiments provided in this application, it should be understood that the disclosed system, apparatus, and method may be implemented in another manner. For example, the described apparatus embodiment is merely an example. For example, division into the units is merely logical function division and may be other division in an actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electrical, mechanical, or another form.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of embodiments.

In addition, functional units in embodiments of this application may be integrated into one processing unit, each of the units may exist alone physically, or two or more units may be integrated into one unit.

When the functions are implemented in the form of a software functional unit and sold or used as an independent product, the functions may be stored in a computer-readable storage medium. Based on such an understanding, the technical solutions of this application essentially, or the part contributing to the conventional technology, or some of the technical solutions may be implemented in a form of a software product. The computer software product is stored in a storage medium, and includes several instructions for instructing a computer device (which may be a personal computer, a server, or a network device) to perform all or some of the steps of the methods described in embodiments of this application. The foregoing storage medium includes: any medium that can store program code, such as a USB flash drive, a removable hard disk, a read-only memory (ROM), a random access memory (RAM), a magnetic disk, or an optical disc.

The foregoing description is merely a specific implementation of this application, but is not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A multi-phase-based Doherty power amplifier control method, wherein the method comprises:

obtaining a baseband signal;

generating two vector signals based on the baseband signal, wherein the two vector signals each comprise a phase signal and an amplitude signal, and the two vector signals are non-orthogonal signals;

obtaining amplitude control signals of a target power amplifier based on quantization encoding of amplitude signals of the two vector signals, wherein the target power amplifier comprises a main power amplifier and an auxiliary power amplifier, and the main power amplifier and the auxiliary power amplifier each comprise a plurality of working cells;

obtaining phase control signals of the target power amplifier based on phase signals of the two vector signals; and controlling, based on the phase control signals and the amplitude control signals, a plurality of working cells in the main power amplifier and the auxiliary power amplifier to output power signals.

2. The method according to claim 1, wherein the amplitude signals corresponding to the two vector signals are ($\rho_1$, $\rho_2$), and the amplitude control signals obtained based on quantization encoding of the amplitude signals comprise amplitude control signals (ACW1, ACW2) of the main power amplifier and amplitude control signals (ACW3, ACW4) of the auxiliary power amplifier.

3. The method according to claim 1, wherein the phase signals corresponding to the two vector signals are ($\varphi_m$, $\varphi_{m+1}$), the phase control signals obtained based on the phase signals are $\cos(\omega_0 t + \varphi_m)$ and $\cos(\omega_0 t + \varphi_{m+1})$, and ($\varphi_m$, $\varphi_{m+1}$) are selected from M non-orthogonal discrete phase bases ($\varphi_1$, . . . , $\varphi_m$, $\varphi_{m+1}$, . . . , $\varphi_M$) based on the phase signals, wherein M is an integer greater than 1, $1 \leq m < M$, and m is an integer.

4. The method according to claim 3, wherein the controlling, based on the phase control signals and the amplitude control signals, a plurality of working cells in the main power amplifier and the auxiliary power amplifier to output power signals comprises:

controlling, based on the phase control signals $\cos(\omega_0 t + \varphi_m)$ and $\cos(\omega_0 t + \varphi_{m+1})$ and the amplitude control signals (ACW1, ACW2) of the main power amplifier, a plurality of first working cells in the main power amplifier to output power signals, wherein the first working cell comprises a plurality of main power amplifier units; and controlling, based on the phase control signals $\cos(\omega_0 t + \varphi_m)$ and $\cos(\omega_0 t + \varphi_{m+1})$ and the amplitude control signals (ACW3, ACW4) of the auxiliary power amplifier, a plurality of second working cells in the auxiliary power amplifier to output power signals, wherein the second working cell comprises a plurality of auxiliary power amplifier units.

5. The method according to claim 4, wherein the plurality of first working cells comprise a first cell and a second cell, and the controlling, based on the phase control signals $\cos(\omega_0 t + \varphi_m)$ and $\cos(\omega_0 t + \varphi_{m+1})$ and the amplitude control signals (ACW1, ACW2) of the main power amplifier, a plurality of first working cells in the main power amplifier comprises:

separately controlling switching start locations of a plurality of main power amplifier units in the first cell and the second cell based on the phase base signals $\cos(\omega_0 t + \varphi_m)$ and $\cos(\omega_0 t + \varphi_{m+1})$; and separately controlling output power signals of a plurality of auxiliary power amplifier units in the first cell and the second cell based on the amplitude control signals ACW1 and ACW2 of the main power amplifier.

6. The method according to claim 4, wherein the plurality of second working cells comprise a third cell and a fourth cell, and the controlling, based on the phase control signals $\cos(\omega_0 t + \varphi_m)$ and $\cos(\omega_0 t + \varphi_{m+1})$ and the amplitude control signals (ACW3, ACW4) of the auxiliary power amplifier, a plurality of second working cells in the auxiliary power amplifier comprises:

separately controlling switching start locations of a plurality of auxiliary power amplifier units in the third cell and the fourth cell based on the phase base signals $\cos(\omega_0 t + \varphi_m)$ and $\cos(\omega_0 t + \varphi_{m+1})$; and separately controlling output power signals of a plurality of auxiliary power amplifier units in the third cell and the fourth cell based on the amplitude control signals ACW3 and ACW4 of the auxiliary power amplifier.

7. The method according to claim 6, wherein when the amplitude signal is less than a first preset threshold, the separately controlling output power signals of a plurality of main power amplifier units in the first cell and the second cell based on the amplitude control signals ACW1 and ACW2 of the main power amplifier comprises:

controlling the plurality of main power amplifier units in the first cell and the second cell to work at first power, wherein the first power is less than second power, and the second power is highest power in a low-voltage mode; and the separately controlling output power signals of a plurality of auxiliary power amplifier units in the third cell and the fourth cell based on the amplitude control signals ACW3 and ACW4 of the auxiliary power amplifier comprises:

controlling disabling of the plurality of auxiliary power amplifier units in the third cell and the fourth cell.

8. The method according to claim 7, wherein when the amplitude signal is less than a second preset threshold and is not less than the first preset threshold, the separately controlling output power signals of a plurality of main power amplifier units in the first cell and the second cell based on the amplitude control signals ACW1 and ACW2 of the main power amplifier comprises:

controlling the plurality of main power amplifier units in the first cell and the second cell to work at the second power; and the separately controlling output power signals of a plurality of auxiliary power amplifier units in the third cell and the fourth cell based on the amplitude control signals ACW3 and ACW4 of the auxiliary power amplifier comprises:

controlling the plurality of auxiliary power amplifier units in the third cell and the fourth cell to work at the first power.

9. The method according to claim 8, wherein when the amplitude signal is less than a third preset threshold and is not less than the second preset threshold, the separately controlling output power signals of a plurality of main power amplifier units in the first cell and the second cell based on the amplitude control signals ACW1 and ACW2 of the main power amplifier comprises:

controlling the plurality of main power amplifier units in the first cell and the second cell to work at third power, wherein the third power is greater than the second power and is less than fourth power, and the fourth power is highest power in a high-voltage mode; and the separately controlling output power signals of a plurality of auxiliary power amplifier units in the third cell and the fourth cell based on the amplitude control signals ACW3 and ACW4 of the auxiliary power amplifier comprises:

controlling the plurality of auxiliary power amplifier units in the third cell and the fourth cell to work at the second power.

10. The method according to claim 9, wherein when the amplitude signal is not less than a fourth preset threshold, the separately controlling output power signals of a plurality of main power amplifier units in the first cell and the second cell based on the amplitude control signals ACW1 and ACW2 of the main power amplifier comprises:

controlling the plurality of main power amplifier units in the first cell and the second cell to work at the fourth power; and the separately controlling output power signals of a plurality of auxiliary power amplifier units in the third cell and the fourth cell based on the amplitude control signals ACW3 and ACW4 of the auxiliary power amplifier comprises:

controlling the plurality of auxiliary power amplifier units in the third cell and the fourth cell to work at the third power.

11. The method according to claim 1, wherein at least one group in the amplitude control signals (ACW1, ACW2) and (ACW3, ACW4) are different control signals.

12. The method according to claim 11, wherein after the generating two vector signals based on the baseband signal, the method further comprises:

performing non-linear compensation on the two vector signals to obtain updated phase signals and updated amplitude signals, wherein the updated phase signals are used to obtain the phase control signals of the target power amplifier, and the updated amplitude signals are used to perform quantization encoding to obtain the amplitude control signals of the target power amplifier.

13. An electronic device, wherein the electronic device comprises at least one processor, and the at least one processor is coupled to at least one non-transitory memory; and the at least one processor is configured to execute a computer program or instructions stored in the at least one non-transitory memory, to enable the electronic device to perform a method comprising:

obtain a baseband signal;

generate two vector signals based on the baseband signal, wherein the two vector signals each comprise a phase signal and an amplitude signal, and the two vector signals are non-orthogonal signals;

obtain amplitude control signals of a target power amplifier based on quantization encoding of amplitude signals of the two vector signals;

obtain phase control signals of the target power amplifier based on phase signals of the two vector signals, wherein the target power amplifier comprises a main power amplifier and an auxiliary power amplifier, and the main power amplifier and the auxiliary power amplifier each comprise a plurality of working cells; and control, based on the phase control signals and the amplitude control signals, a plurality of working cells in the main power amplifier and the auxiliary power amplifier to output power signals.

14. The electronic device according to claim 13, wherein the amplitude signals corresponding to the two vector signals are $(\rho_1, \rho_2)$, and the amplitude control signals obtained based on quantization encoding of the amplitude signals comprise amplitude control signals (ACW1, ACW2) of the main power amplifier and amplitude control signals (ACW3, ACW4) of the auxiliary power amplifier.

15. The electronic device according to claim 14, wherein the phase signals corresponding to the two vector signals are $(\phi_m, \phi_{m+1})$, the phase control signals obtained based on the phase signals are $\cos(\omega_0 t + \varphi_m)$ and $\cos(\omega_0 t + \varphi_{m+1})$, and $(\varphi_m, \varphi_m)$ are selected from M non-orthogonal discrete phase bases $(\varphi_1, \ldots, \varphi_m, \varphi_{m+1}, \ldots, \varphi_M)$ based on the phase signals, wherein M is an integer greater than 1, $1 \leq m < M$, and m is an integer.

16. The electronic device according to claim 15, wherein the at least one processor is configured to:

control, based on the phase control signals $\cos(\omega_0 t + \varphi_m)$ and $\cos(\omega_0 t + \varphi_{m+1})$ and the amplitude control signals (ACW1, ACW2) of the main power amplifier, a plurality of first working cells in the main power amplifier to output power signals, wherein the first working cell comprises a plurality of main power amplifier units; and control, based on the phase control signals $\cos(\omega_0 t + \varphi_m)$ and $\cos(\omega_0 t + \varphi_{m+1})$ and the amplitude control signals (ACW3, ACW4) of the auxiliary power amplifier, a plurality of second working cells in the auxiliary power amplifier to output power signals, wherein the second working cell comprises a plurality of auxiliary power amplifier units.

17. The electronic device according to claim 16, wherein the plurality of first working cells comprise a first cell and a second cell, and the at least one processor is configured to:

separately control switching start locations of a plurality of main power amplifier units in the first cell and the second cell based on the phase base signals $\cos(\omega_0 t + \varphi_m)$ and $\cos(\omega_0 t + \varphi_{m+1})$; and separately control output power signals of a plurality of auxiliary power amplifier units in the first cell and the second cell based on the amplitude control signals ACW1 and ACW2 of the main power amplifier.

18. The electronic device according to claim 16, wherein the plurality of second working cells comprise a third cell and a fourth cell, and the at least one processor is configured to:

separately control switching start locations of a plurality of auxiliary power amplifier units in the third cell and the fourth cell based on the phase base signals $\cos(\omega_0 t + \varphi_m)$ and $\cos(\omega_0 t + \varphi_{m+1})$, and separately control output power signals of a plurality of auxiliary power amplifier units in the third cell and the fourth cell based on the amplitude control signals ACW3 and ACW4 of the auxiliary power amplifier.

19. The electronic device according to claim 18, wherein when the amplitude signal is less than a first preset threshold, the at least one processor is configured to:

control the plurality of main power amplifier units in the first cell and the second cell to work at first power, wherein the first power is less than second power, and the second power is highest power in a low-voltage mode; and control disabling of the plurality of auxiliary power amplifier units in the third cell and the fourth cell.

20. The electronic device according to any one of claim 19, wherein when the amplitude signal is less than a second preset threshold and is not less than the first preset threshold, the at least one processor is configured to:

control the plurality of main power amplifier units in the first cell and the second cell to work at the second power; and control the plurality of auxiliary power amplifier units in the third cell and the fourth cell to work at the first power.

\* \* \* \* \*